United States Patent [19]

Wall et al.

[11] 4,405,918
[45] Sep. 20, 1983

[54] CURRENT SENSING OF CAPACITIVE KEYBOARD ARRAYS

[75] Inventors: Frederick G. Wall, Garland; Stephen C. Kwan, Plano, both of Tex.

[73] Assignee: Texas Instruments Incorporated, Dallas, Tex.

[21] Appl. No.: 126,601

[22] Filed: Mar. 3, 1980

[51] Int. Cl.³ .................................................. G06F 3/02
[52] U.S. Cl. .......................... 340/365 C; 200/DIG. 1; 307/115; 340/365 S
[58] Field of Search .......... 340/365 R, 365 C, 365 E, 340/365 S, 365 L; 200/DIG. 1; 179/90 K; 178/17 C; 307/115-117; 335/186

[56] References Cited

U.S. PATENT DOCUMENTS

| | | | |
|---|---|---|---|
| 3,492,440 | 1/1970 | Cerbone et al. | 340/365 C |
| 3,705,367 | 12/1972 | Peil et al. | 340/365 L |
| 3,971,013 | 7/1976 | Challoner et al. | 340/365 C |
| 4,176,575 | 12/1979 | Munch | 200/DIG. 1 |

Primary Examiner—James J. Groody
Attorney, Agent, or Firm—John A. Haug; James P. McAndrews; Melvin Sharp

[57] ABSTRACT

Current sensing circuits especially adapted for use with either capacitive touch plate or mechanical switch keys. The circuits include a transistor whose base is connected to a constant voltage source and whose emitter-collector circuit is connected between the touch plate or switch keys and an input to a comparator. A second transistor and a capacitor are interconnected with the first transistor to provide transient surge protection. The circuits distinguish between differing values of current and activate the comparator which produces a signal indicative of the existing condition.

17 Claims, 6 Drawing Figures

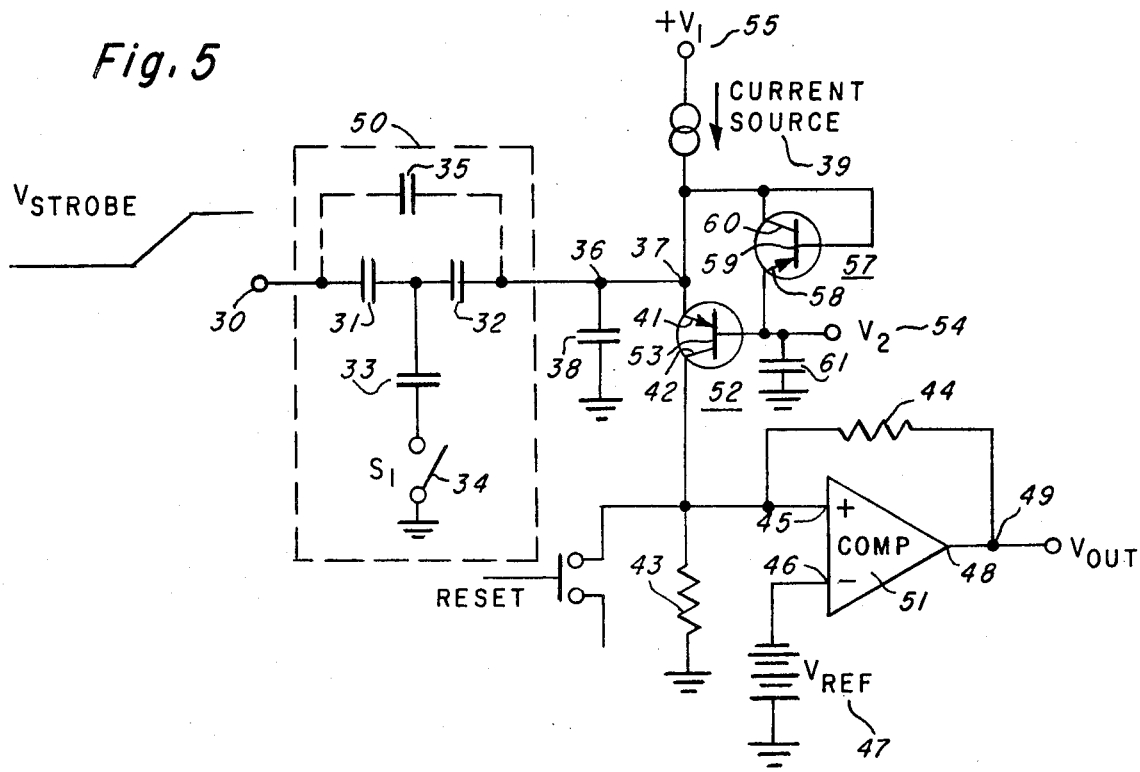
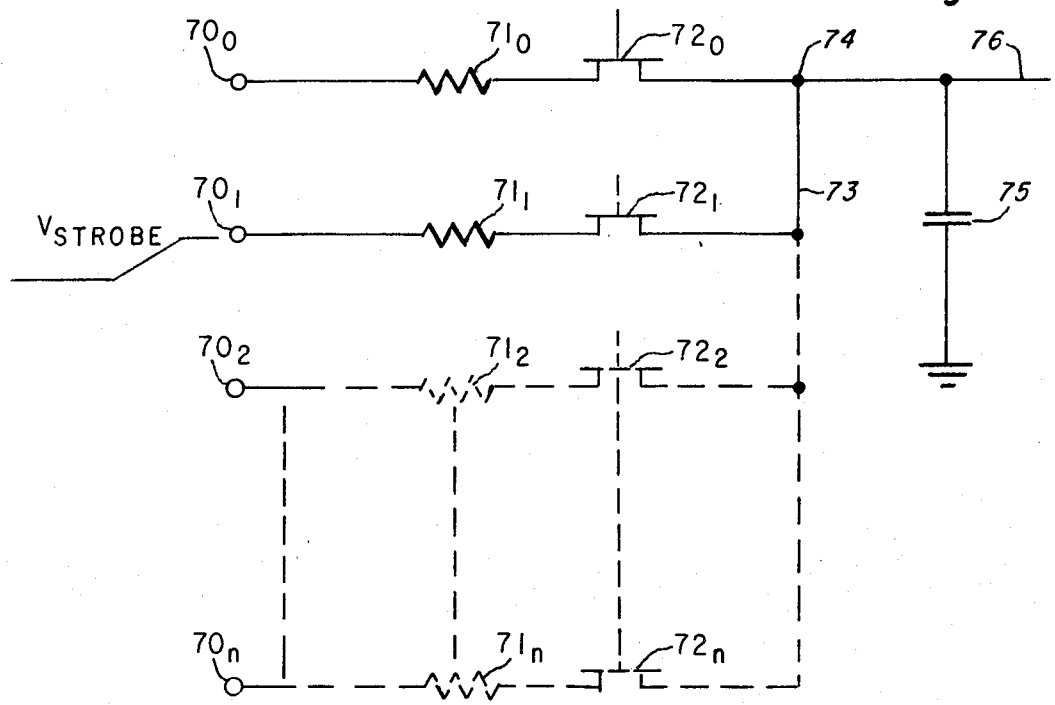

CURRENT SENSING OF CAPACITIVE KEYBOARD ARRAYS

INTRODUCTION AND BACKGROUND

This invention relates to transient current sensing of keyboards and more particularly to keyboards of the capacitive touch-plate type.

Capacitive touch-plate keyboards and attendant sensing circuits have heretofore been known, illustrative of which those disclosed in U.S. Pat. Nos. 4,293,987 and 4,304,976 in the names of Tom L. Gottbreht and Glen C. Shepherd.

While capacitive touch switch panels have constituted marked improvements over the prior designs, and while the interrogating and sensing circuits have operated satisfactorily, the necessity of paralleling certain interrogating and sensing circuits to achieve reasonable economies has resulted in the requirement for very tight manufacturing and adjustment tolerances as will hereinafter be described in greater detail, thus adding to cost of manufacture and subsequent operational vulnerability.

Accordingly, it is one general object of this invention to improve capacitive touch switch panel sensing circuits.

It is another object of this invention to reduce the manufacturing costs of such circuits.

It is still another object of this invention to provide circuits having greater latitudes of operability, thereby permitting the relaxation of certain manufacturing tolerances and achieving improvement in cost.

It is still another object of this invention through the provision of greater tolerances, to render the circuits less vulnerable subsequently to malfunction.

Accordingly, and in accordance with one feature of the invention, a plurality of capacitive touch switches are connected to a common comparator circuit, and a source of constant voltage is connected to the sensing circuits, thereby permitting the utilization of transient current as the key activation representing condition.

In accordance with another feature of the invention, the transient current is sensed by a corresponding change in voltage at a voltage comparator.

In accordance with still another feature of the invention, a connection is advantageously made from the output of the voltage comparator to a selected one of the comparator inputs, thereby, in cooperative association with other circuit elements, providing a type of comparator hysteresis.

In accordance with still another feature of the invention, through the use of current sensing, a plurality of keys can be connected to a single sensor without substantially degrading circuit characteristics, and a relatively low voltage source can be used.

These and other objects and features of the invention will be apparent from the following description, by way of example, with reference to the drawing in which:

DRAWINGS

FIG. 5 depicts circuits illustrating the basic features of the invention hereof; and FIG. 6 is a schematic electrical wiring diagram of the basic current sensing and latching circuitry.

THE PRIOR ART

Figure 1:
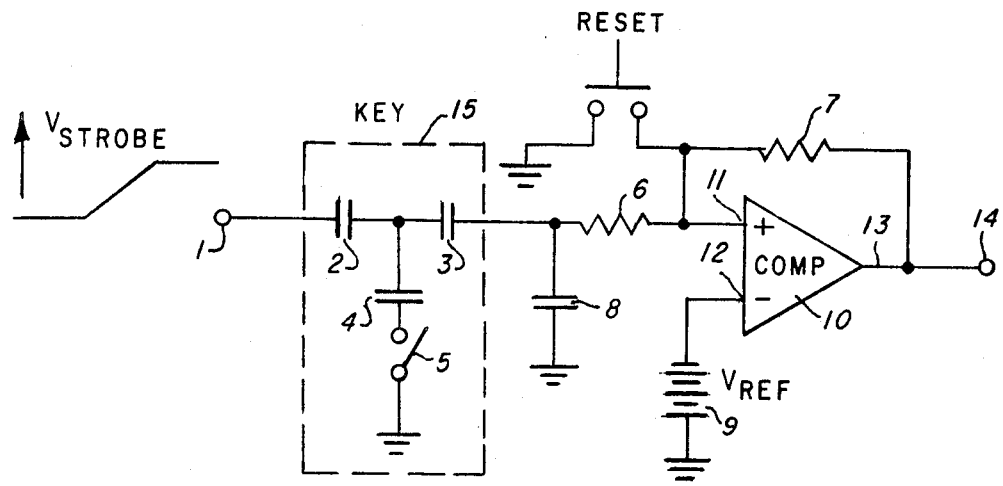
FIG. 1 is a schematic diagram illustrating a typical keyboard sensing circuit of the prior art.

The diagram of FIG. 1 illustrates typical voltage change sensing circuits of the prior art. There, $V_{strobe}$ is a constant rise time voltage strobe which is applied to the input 1.

Serially connected capacitors 2 and 3 are interposed between input terminal 1 and resistor 6, with capacitor 4 branching off from the junction between capacitors 2 and 3 and being connected through switch 5 to ground. These capacitors are not separate discrete components but are capacitances exhibited by the conventional capacitive touch key. Also connected into the circuit are capacitor 8, resistor 7 and reference voltage source 9, which are interconnected with terminals 11, 12 and 13 of comparator 10.

In operation, when the strobe voltage is applied to input terminal 1, capacitors 2, 3 and 8 form a voltage distribution circuit along with resistor 6. After a brief transient, the strobe voltage is proportionately distributed along that series circuit. However, if the capacitive touch switch (represented by the elements within dotted rectangle 15) is touched, the effect is as if virtual switch 5 is closed, thereby resulting in a different distribution of the voltages across the circuit elements.

If a key is not touched, then in the circuits of FIG. 1, the distribution of voltages is such as to result (after a brief transient) in the input to terminal 11 of comparator 10 being significantly higher than the voltage applied to terminal 12, thereby raising or switching the voltage at output terminal 13 and 14 to a logical high. Feedback of this voltage via resistor 7 to the input terminal 11 provides a desired level of hysteresis so as to maintain the output in that condition for a period of time required for operability of remaining circuitry (not shown).

When the touch switch key is touched (and the circuits respond as if virtual switch 5 were closed), then a much lower potential is introduced to the input terminal 11 of the comparator 10. Ideally, the reference voltage from source 9 is adjusted to a value approximately midway between the two voltages which, as mentioned above, are applied to input 11 of comparator 10.

Figure 2:
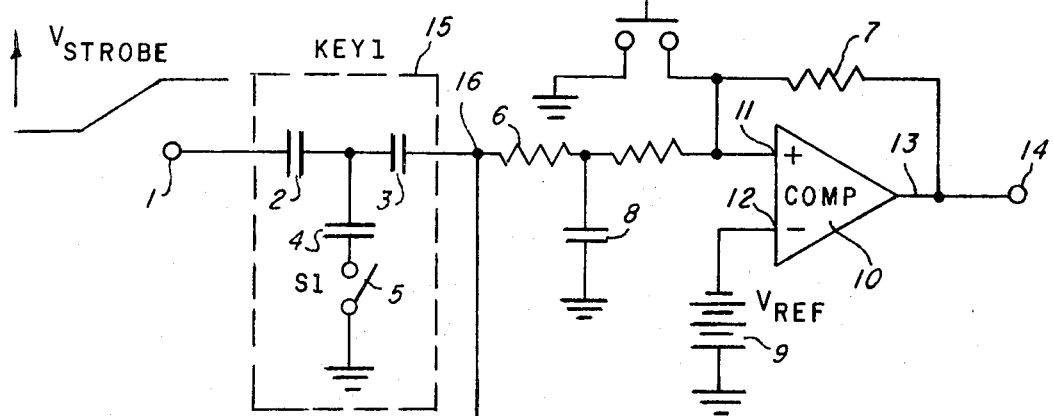
FIG. 2 is an electrical schematic diagram depicting two capacitive touch switch keys connected together to a common voltage comparator.
Figure 2:
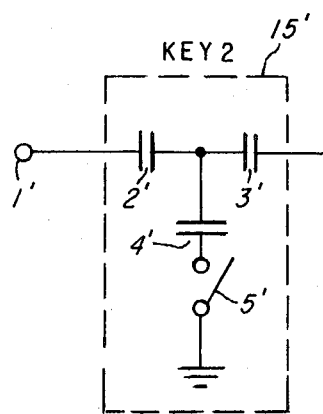

Now referring to FIG. 2, it will be observed that there are therein depicted two capacitive touch switches similar to the switch of FIG. 1 and identified with like symbols. Also included is a single sensing circuit similar to the corresponding circuit of FIG. 1. However, in order to achieve necessary circuit economies, both keys 15 and 15' are served by comparator 10, a common connection being made at circuit junction 16.

Figure 3:
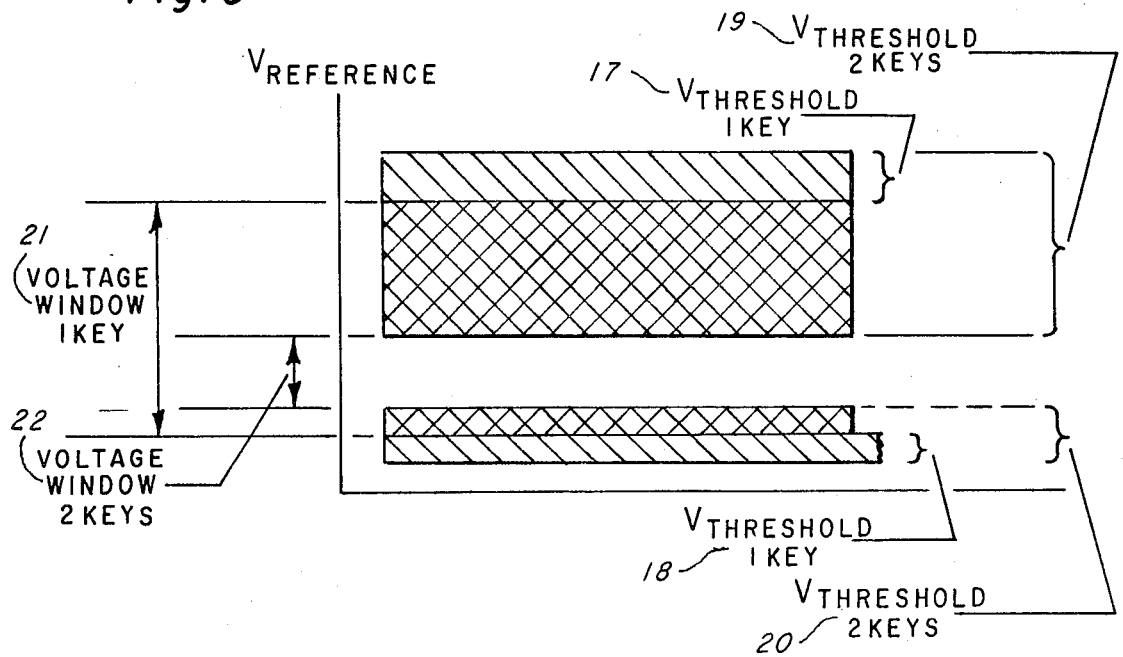
FIG. 3 is a graphical representation illustrating the degradation in circuit voltage tolerance resulting from the connection of more than one switch to the same comparator sensing circuits.

FIG. 3 illustrates the reduction in circuit operating voltage tolerances resulting from serving two keys rather than one by the same comparator. There, it will be observed that with one key connected to the comparator, the voltage thresholds 17 and 18 associated with one key are relatively small, thereby providing a relatively large single key voltage window 21. On the other hand, as a consequence of the additional voltage distribution resulting from the addition of the second key circuitry, the dual key thresholds 19 and 20 are substantially larger, thereby leaving a greatly diminished voltage window 22.

Figure 4:
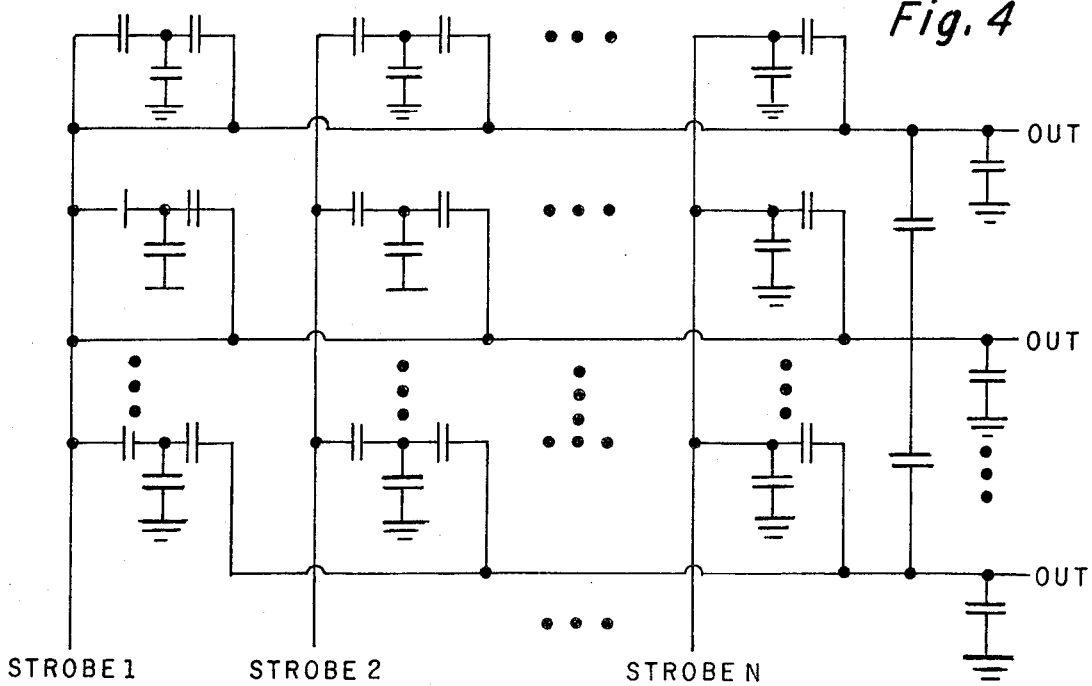
FIG. 4 depicts a typical matrix of capacitive touch switch keys and attendant circuitry.

While the percentage reduction in voltage windows resulting from the addition of more keys to the common comparator is less than the ratio between windows 21 and 22, the voltage window nevertheless rapidly becomes unacceptably small. Therefore, when a matrix similar to that shown in FIG. 4 results in the connection of three or more keys to each comparator, manufacturing and adjustment tolerances become excessively critical.

THE PRESENT INVENTION

Reference is now made to FIG. 5 which depicts the basic circuits embodying the present invention. There, a capacitive touch switch 50 will be observed to include capacitors 31, 32 and 33, as well as virtual switch 34, which correspond respectively to capacitors 2, 3 and 4 and switch 5 of FIG. 1. Also included is a source of strobe voltage similar to that of FIG. 1. This strobe voltage is applied to terminal 30 which corresponds to terminal 1 of FIG. 1. However, except for comparator 51 and feedback resistor 44 which correspond respectively to comparator 10 and feedback resistor 7 of FIG. 1, capacitor 38 which corresponds to capacitor 8, and except for the source of reference voltage 47 which corresponds to voltage source 9 in FIG. 1, the circuitry is significantly different.

In FIG. 5 there are included transistors 52 and 57. The former includes emitter 41, base 53 and collector 42; whereas the latter includes emitter 58, base 59 and collector 60. Also included are capacitor 38 which is connected to the connection leading from capacitor switch key 50 to emitter 41 of transistor 52. Further, there is included a current source 39 leading from voltage source 55 to junction 37, voltage source 54 connected to the base 53 of transistor 52, and resistor 43 further interconnecting the collector 42 to ground.

In operation, the voltage appearing at node 36 is essentially constant because of the fixed nature of the voltage applied to base 53 of transistor 52 via voltage source 54. Moreover, the ratios of the voltages are such as to maintain transistor 52 in an active condition, i.e., the base-emitter junction being forward biased, resulting in the maintenance of voltage at node 37 as being essentially constant. However, during the strobe transient, current flowing through transistor 52 will vary markedly depending upon whether capacitive switch-touch plate key 50 is touched or not.

Dotted capacitor 35 represents the equivalent capacitance of the combination of capacitors 31, 32 and 33. As will be observed by those skilled in the art, this equivalent capacitance will vary markedly depending upon whether the key is touched (i.e., virtual switch 34 is closed) or whether it is not. If untouched, equivalent capacitance 35 is substantially greater than when in the touched condition. Accordingly, the current flowing from terminal 30 through capacitors 31 and 32 (i.e., through equivalent capacitance 35) will be substantially larger in the untouched than in the touched condition, the value of this current being equal to $C_{eg} dv/dt$, where $C_{eg}$ is the capitance of equivalent capacitor 35. Since the strobe voltage were shape determines dv divided by dt, and since it will be similar in both the touched and untouched key conditions, it will be observed that a change in $C_{eg}$ will bring about a corresponding change in current.

Capacitor 38 is basically a capacitance associated with multiple keys and unavoidable parasitics to ground. Since in accordance with the instant invention, the potential thereat is maintained essentially constant, no appreciable current or voltage change occurs at capacitor 38, and the circuits are therefore essentially independent of the number of keys that are commonly connected thereto.

As mentioned above, since the equivalent capacitance 35 will be substantially greater in the untouched condition, current flowing to node 37 and consequently to emitter 41 will flow through the emitter and the collector circuit comprising collector 42 and grounding resistor 43. While a minute portion of it may flow to terminals 45 of comparator 51 and via resistor 44 to output 49, such portion is neglibible and the principal portion of it will flow through resistor 43, thereby developing a corresponding voltage drop thereacross and thereby raising the level of the voltage appearing at input 45.

When capacitive switch-touch key 50 is in the touched condition, capacitance 35 is substantially reduced. Accordingly, when the strobe voltage appears at input 30, the corresponding current is substantially less than when in the untouched condition, for the value of equivalent capacitance is substantially less as described above. Accordingly, the current component which appears at node 37 and emitter 41 is correspondingly less, thereby bringing about a correspondingly smaller flow of current in collector 42 and resistor 43, and developing a correspondingly smaller voltage drop across resistor 43 which conditions the voltage at input terminal 45 of comparator 51 to a similarly lower value. If, as mentioned above, the voltage applied to terminal 46 of comparator 51 from voltage reference 47 is adjusted to fall halfway in between these two values, it will be observed in the one instance a substantial voltage output signal will occur at output 48, whereas in the other condition, such voltage will not appear.

As mentioned above, the circuits of FIG. 5 also include transistor 57 which has emitter 58 connected to the base of transistor 52 and one electrode of capacitor 61, base 59 connected to collector 60, and collector 60 connected to base 59 and the interconnection of current source 39 with node 37. Transistor 57, in cooperative co-action with the circuitry in which it is connected, is effective to provide protection against high voltage surges.

As is known to those skilled in the art, many electronic components that are presently attractive for commercial use, are nevertheless quite vulnerable to high voltage surges. For example, in some metal-oxide-semiconductors, potentials much in excess of 30 volts on the gates will result in catastrophic and non-reversible failure. Static potentials build-up on persons walking across certain types of carpets may approach tens of thousands of volts and result in static discharge of as much as one ampere of current. When a person thus highly charged touches the key of a capacitance touch plate switch, a very high transient surge occurs and is transmitted over the attendant conductors into the associated circuits. Transistor 57 and capacitor 61 provide a means of safely disposing of such surges in the manner now to be described.

Referring again to FIG. 5, it will be observed that a voltage current surge at the touch plate switch will be conducted to node 37 and thence to emitter 41 of transistor 52 and base 59/collector 60 of transistor 57. If the surge potential is positive, then it will tend to increase the forward bias of transistor 52 which is rapidly driven into saturation, whereupon, the static discharge current is conducted via the base 53 to capacitor 61 where it is safely dissipated. While the positive going surge is being conducted through transistor 52, transistor 57 will be cut off by virtue of the reverse bias occurring at base 59.

If the aforementioned surge potential is negative, then it will tend to cut off transistor 52. However, transistor 57 will be biased into its forward conducting region, and the surge current will be safely conducted to surge-dissipating capacitor 61.

Although the principles embodied in the inventions hereof are particularly attractive when operatively associated with capacitive touch-plate type keys, they nevertheless are effective when operatively associated with mechanical switches or the like, thus rendering them particularly desirable for production serving both capacitive and mechanical switch assembly.

FIG. 6 depicts a matrix of mechanical switches illustrating this feature. There, it will be observed, is a voltage strobe similar to that hereinbefore described, applied sequentially to terminals $70_o$-$74_n$ and thence through resistors $71_o$-$71_n$ to individual mechanical switches $72_o$-$72_n$ whose remaining connections are commoned together via conductor 73 and node 74. Capacitor 75 generally corresponds to capacitor 38 of FIG. 5, and conductor 76 connects the matrix to the attendant circuitry. As the matrix would be in lieu of capacitive touch-plate switches, the matrix would connect via conductor 76 to a point generally illustrated by node 37 in FIG. 5. Operation of the sensing circuits connected to the circuits of FIG. 6 is similar to that hereinabove described.

It will now be evident to those skilled in the art that the circuits hereof embody inventions giving rise to a number of advantages. Thus, through the efficacious employment of current, as contrasted with voltage sensing, greater freedom in manufacturing tolerances is provided. Moreover, vulnerability to static discharges is minimized, and ranges over which the circuits will effectively respond are improved.

It will also be evident to those skilled in the art that although the description hereof illustrates the invention in specific embodiments, other circuit components and interconnections might be employed without departing from the scope and spirit thereof. For example, although transistors 52 and 57 are illustrated as being of the PNP type which are well known as being able to withstand substantial electrical surges, other circuit configurations could be employed together with appropriate current dissipating circuits (e.g., Zener diodes). Moreover, conventional MOS, J-FET or similar devices may be employed in lieu of the bipolar devices.

The terms and expressions employed are intended as terms of description and not of limitation, and there is no intention in the use thereof of excluding any equivalents but on the contrary, it is intended to include any and all equivalents, adaptations and modifications that may be employed without departing from the spirit and scope of the invention.

We claim:

1. In combination, a capacitive keyboard having keys each exhibiting a first value of capacitance when touched and a different value when untouched, electrical interrogating means connected to said keyboard and effective periodically to apply to the keys of said keyboard an interrogating electrical signal, means also interconnected with said keys and responsive to the application of said interrogating electrical signal for developing a first level of current flow when a key is touched and for developing a second different level of current flow when said key is untouched, both of said levels of current flow being greater than zero, said means for developing said first and said different level of current flow includes a capacitor and circuit means including a transistor for establishing across said capacitor a first voltage when said key is touched and essentially the same voltage when said key is untouched and sensing means interconnected with said keyboard and responsive to said current flow for distinguishing between said first level and said second level.

2. A combination in accordance with claim 1 in which said interrogating electrical signal has a ramp waveform.

3. A combination in accordance with claim 1 in which said means for developing said first level of current flow includes a source of constant voltage.

4. A combination in accordance with claim 1 in which said sensing means includes a pair of transistors, each having a base, emitter and collector, a source of constant voltage connected to the base of one of said transistors, and circuit means connecting the keys of said keyboard to the emitter of said one of said transistors.

5. A combination in accordance with claim 4 in which said sensing means includes a voltage comparator connected to the collector of said one of said transistors.

6. A combination in accordance with claim 5 in which said voltage comparator is further connected to a fixed voltage reference.

7. In combination, a keyboard having a plurality of keys, each adapted to exhibit one of two different circuit conditions when not depressed and the other circuit condition when depressed, said two different circuit conditions being open circuit and closed circuit conditions, said keys each having a pair of terminals, electrical interrogating means connected to said keyboard and effective periodically to apply to one of the terminals of each key an interrogating electrical signal, means interconnected with the remaining terminal of each key including a constant voltage source and responsive to the application of said interrogating electrical signal for developing a first level of current flow when a key is depressed and a second level of current flow when said key is not depressed, both of said levels of current flow being greater than zero, said means for developing said first and said different level of current flow includes a capacitor and circuit means including a transistor for establishing across said capacitor a first voltage when said key is not depressed and essentially the same voltage when said key is depressed and sensing means interconnected with said constant voltage sources and said keyboard and responsive to said current flow for distinguishing between said first level and said second level.

8. A combination in accordance with claim 7 in which said interrogating electrical signal has a ramp waveform.

9. In combination, a keyboard having a plurality of keys, each adapted to exhibit one of two different circuit conditions when not depressed and the other circuit condition when depressed, said two different circuit conditions being open circuit and closed circuit conditions, said keys each having a pair of terminals, electrical interrogating means connected to said keyboard and effective periodically to apply to one of the terminals of each key an interrogating electrical signal, means interconnected with the remaining terminal of each key including a constant voltage source and responsive to the application of said interrogating electrical signal for developing a first level of current flow when a key is depressed and another level of current flow when said key is not depressed, both of said levels of current flow being greater than zero, said means for developing said first and said different levels of current flow includes a capacitor and means for developing a first level of current flow when said key is depressed and a different level of current flow when said key is not depressed and sensing means interconnected with said constant voltage sources and said keyboard and responsive to said current flow for distinguishing between said first level and said second level.

10. A combination in accordance with claim 9 in which said interrogating electrical signal has a ramp waveform.

11. In combination, a keyboard, electrical interrogating means connected to said keyboard and effective periodically to apply to the keys of said keyboard an interrogating electrical signal producing a transient current, means to sense the transient current including a transistor having a base, emitter and collector, a source of constant voltage connected to the base of said transistor to maintain said transistor in an active condition, circuit means connecting the keys of said keyboard to the emitter of said transistor, said circuit means including a current source, and voltage sensitive switching means having an output connected to the collector of said transistor whereby a change in transient current produced by the interrogating means which flows through the transistor is sensed by a corresponding change in voltage at the voltage sensitive switching means to control the voltage sensitive switching means output.

12. A combination in accordance with claim 11 in which the switching means includes a voltage comparator.

13. A combination comprising a keyboard, electrical interrogating means connected to said keyboard and effective periodically to apply to the keys of said keyboard an interrogating electrical signal, a transistor having a base, emitter and collector, a source of constant voltage connected to the base of said transistor to maintain said transistor in an active condition, circuit means connecting the keys of said keyboard to the emitter of said transistor, said circuit means including a current source, switching means connected to the collector of said transistor, the combination including transient protection means for said transistor comprising a second transistor having a base, emitter and collector, the emitter of said second transistor connected to the base of the first of said transistors, the base of said second transistor connected to the collector of said second transistor and the emitter of the first of said transistors, and a capacitor connected on one side to the base of the first of said transistors and the emitter of said second transistor and the other side of the capacitor connected to ground.

14. In combination, a capacitive keyboard having keys each exhibiting a first value capacitance when touched and a different value when untouched, electrical interrogating means connected to said keyboard and effective periodically to apply to the keys of said keyboard an interrogating electrical signal, means also interconnected with said keys including a constant voltage source and responsive to the application of said interrogating electrical signal for developing a first level of current flow when a key is touched and for developing a second different level of current flow when said key is untouched, both of said levels of current flow being greater than zero, said means for developing said first and said different levels of current flow includes a capacitor and means for developing a first level of current flow when said key is touched and a different level of current flow when said key is untouched, and sensing means interconnected with said keyboard and responsive to said current flow for distinguishing between said first level and said second level.

15. A combination in accordance with claim 14 in which said sensing means includes a pair of transistors, each having a base, emitter and collector, a source of constant voltage connected to the base of one of said transistors, and circuit means connecting the keys of said keyboard to the emitter of said one of said transistors.

16. A combination in accordance with claim 15 in which said sensing means includes a voltage comparator connected to the collector of said one of said transistors.

17. A combination in accordance with claim 16 in which said voltage comparator is further connected to a fixed voltage reference.

* * * * *